(12) United States Patent
Huguenin et al.

(10) Patent No.: US 8,772,879 B2
(45) Date of Patent: Jul. 8, 2014

(54) ELECTRONIC COMPONENT COMPRISING A NUMBER OF MOSFET TRANSISTORS AND MANUFACTURING METHOD

(75) Inventors: Jean-Luc Huguenin, Grenoble (FR); Stéphane Monfray, Eybens (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/488,038

(22) Filed: Jun. 4, 2012

(65) Prior Publication Data

US 2012/0313182 A1    Dec. 13, 2012

(30) Foreign Application Priority Data

Jun. 7, 2011  (FR) ...................................... 11 54929

(51) Int. Cl.
*H01L 21/336* (2006.01)
*H01L 29/78* (2006.01)

(52) U.S. Cl.
USPC .......................................... 257/369; 438/284

(58) Field of Classification Search
USPC ................... 257/366, 369, 392; 438/283, 284
See application file for complete search history.

(56) References Cited

U.S. PATENT DOCUMENTS

| 6,989,570 B2 * | 1/2006 | Skotnicki et al. ............. 257/347 |
| 2003/0216038 A1 | 11/2003 | Madhukar et al. |
| 2006/0068575 A1 | 3/2006 | Gluschenkov et al. |
| 2006/0081876 A1* | 4/2006 | Monfray et al. ............... 257/192 |
| 2006/0115939 A1 | 6/2006 | Walker et al. |
| 2007/0023817 A1 | 2/2007 | Dao |
| 2007/0052037 A1* | 3/2007 | Luan ............................. 257/369 |
| 2007/0063284 A1 | 3/2007 | Kawahara et al. |
| 2007/0249103 A1 | 10/2007 | Dao |
| 2009/0039433 A1 | 2/2009 | Yang et al. |
| 2011/0108942 A1 | 5/2011 | Fenouillet-Beranger et al. |
| 2011/0121391 A1 | 5/2011 | Monfray et al. |
| 2013/0049140 A1* | 2/2013 | Asenov et al. ................. 257/411 |

OTHER PUBLICATIONS

French Search Report and Written Opinion dated Jan. 13, 2012 from corresponding French National Application No. 11/54929.

* cited by examiner

*Primary Examiner* — Matthew W Such
*Assistant Examiner* — Warren H Kilpatrick
(74) *Attorney, Agent, or Firm* — Wolf, Greenfield & Sacks, P.C.

(57) ABSTRACT

An electronic component including a number of insulated-gate field effect transistors, said transistors belonging to at least two distinct subsets by virtue of their threshold voltage, wherein each transistor includes a gate that has two electrodes, namely a first electrode embedded inside the substrate where the channel of the transistor is defined and a second upper electrode located above the substrate facing buried electrode relative to channel and separated from said channel by a layer of dielectric material and wherein the embedded electrodes of all the transistors are formed by an identical material, the upper electrodes having a layer that is in contact with the dielectric material which is formed by materials that differ from one subset of transistors to another.

16 Claims, 11 Drawing Sheets

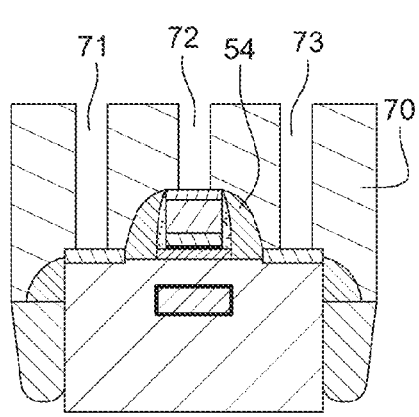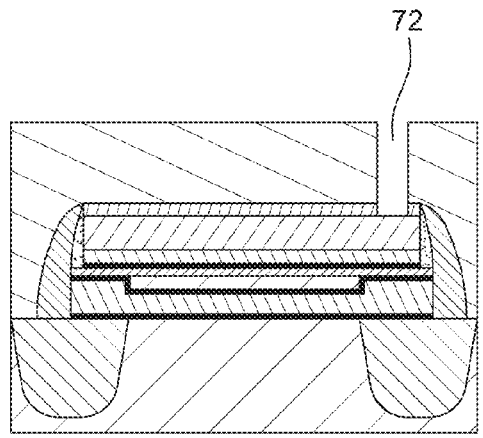
Fig. 16    Fig. 17
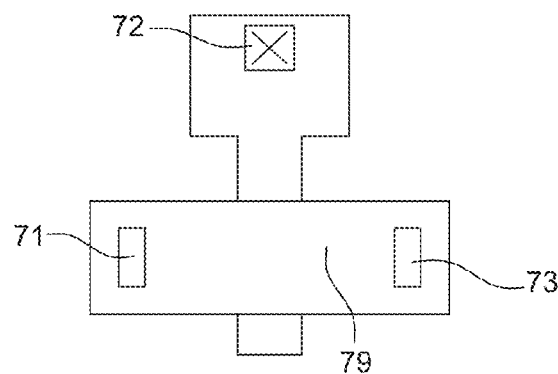
Fig. 18
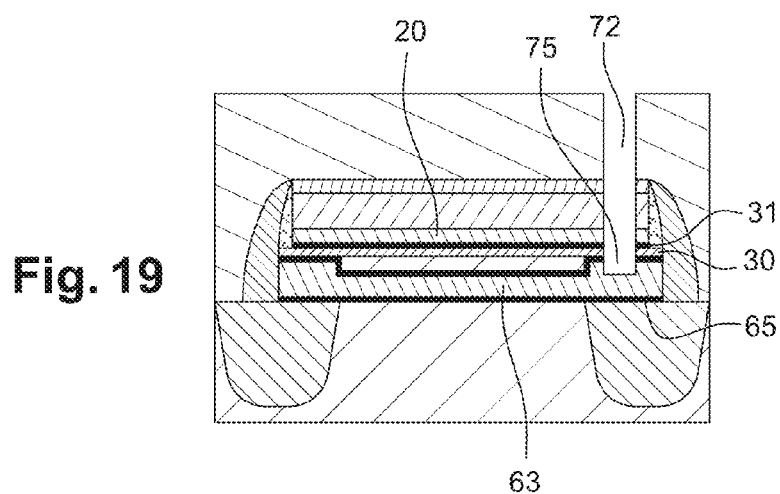
Fig. 19

ELECTRONIC COMPONENT COMPRISING A NUMBER OF MOSFET TRANSISTORS AND MANUFACTURING METHOD

CROSS REFERENCE TO RELATED APPLICATIONS

This application claims the priority benefit of French patent application number 11/54929, filed on Jun. 7, 2011, which is hereby incorporated by reference to the maximum extent allowable by law.

BACKGROUND

1. Technical Field

The invention relates to the technical field of microelectronics and relates more particularly to a new insulated-gate field effect transistor (or MOSFET) structure and relevant manufacturing methods.

2. Discussion of the Related Art

In the field of circuits that contain MOSFET transistors, reduced dimensions have resulted in changes in the structure of the actual transistors in order to overcome the problem of parasitic phenomena that are capable of impairing the performance of components.

Thus, there is an alternative solution for fabricating the channel of transistors without employing silicon doping techniques. This solution involves using composite gate structures referred to as "double-gate" structures in which the channel of the transistor is delimited by two opposite-facing gates. A first part of the gate is therefore located on the upper face of the substrate whereas the second part of the gate is embedded in the substrate and this makes it possible to avoid using doped silicon at the edges of the channel.

SUMMARY

In certain applications, there may be a need for transistors that have slightly different characteristics, especially in terms of their threshold voltage.

One embodiment provides an electronic component comprising a number of insulated-gate field effect transistors, said transistors belonging to at least two distinct subsets by virtue of their threshold voltage, in which each transistor has two gates, namely a first gate embedded or buried in the substrate where the channel of the transistor is defined and a second gate, or upper gate, located above the substrate facing the buried gate relative to the channel and separated from said channel by a layer of dielectric material and wherein the buried gates of all the transistors are formed by an identical material, the upper gates having a layer that is in contact with the dielectric material which is formed by a material that differs from one subset of transistors to another.

Obviously, this principle can be extended to as many subsets of threshold voltages as required. Thus, in practice, the transistors can, for instance, be divided up into three distinct subsets.

According to other embodiments:

The upper gates can be formed by stacking layers of different materials, with the number of layers differing from one subset of transistors to another.

The material of the buried gates can be different from the materials of the upper gates of all the subsets of transistors. The material of the buried gates can belong to the group of materials used to form the upper gates.

In various embodiments, for NMOS type transistors, the material of the upper gate of a first subset may be chosen from the group comprising aluminum and molybdenum. The material of the upper gate of a second subset may be chosen from the group comprising tantalum nitride and titanium nitride. The material of the upper gate of a third subset may be chosen from the group comprising titanium nitride and cobalt disilicide ($CoSi_2$).

In other embodiments, for PMOS type transistors, the material of the upper gate of a first subset may be chosen from the group comprising nickel, gold and platinum. The material of the upper gate of a second subset may be chosen from the group comprising silicon and nickel. The material of the upper gate of a third subset may be chosen from the group comprising titanium nitride and cobalt disilicide ($CoSi_2$).

Such a structure can be obtained using several alternative methods depending on the desired technology. Thus, according to another embodiment, there is provided a method for manufacturing a number of insulated-gate field effect transistors on a semiconductor substrate which involves:

Making a recessed opening in the substrate located underneath the channel of each transistor;

Above each channel, producing upper gate structures having at least two types of metallic materials defining at least two subsets of transistors that have different thresholds voltages;

Depositing, in the recessed openings, a dielectric material then filling the openings with an identical metallic material for all the transistors in order to define a buried gate structure. Different versions can be envisaged depending on the desired or available materials, applications and technologies. In practice, one can deposit the metallic materials of the upper gate structures by successively depositing different metal layers with the number of deposited layers defining the subset to which the transistor belongs.

In a first embodiment:

One forms the openings then one fills them with a sacrificial material;

One produces the upper gate structures, including the metallic materials;

One removes the sacrificial material from the openings;

One fills the recessed openings with a metallic material.

In a second embodiment:

One forms upper gate structures by using a sacrificial material instead of electrodes;

One produces recessed openings;

One removes the sacrificial material from the upper gate structures;

One deposits the metallic materials of the upper gate structure;

One fills the recessed openings with a metallic material.

In a third embodiment:

One produces the recessed openings and the areas that form the locations of the upper gate structures at the same time;

One deposits the metallic materials of the upper gate structures in said areas;

One fills the recessed openings with a metallic material.

BRIEF DESCRIPTION OF THE DRAWINGS

Certain aspects of the embodiments and the resulting advantages will be readily apparent from the description of the following embodiments, reference being made to the accompanying drawings in which:

FIGS. 16, 17 and 18 are transverse, longitudinal and top cross-sectional views respectively of a transistor as fabricated using the first example of the manufacturing method and shown at the time when the gate, source and drain contacts are created.

FIG. 19 is a view similar to FIG. 17 showing a subsequent step in producing the gate contact.

FIGS. 18 to 27 are transverse cross-sectional views showing the sequencing of the various steps involved in manufacturing in accordance with a second example of the manufacturing method.

Obviously, the various elements shown in the Figures are depicted exclusively to make the embodiments easier to understand. Certain elements that have no direct bearing on the embodiments may therefore have been omitted. Similarly, the dimensions and proportions of each of the elements shown are indicated only with a view to making the embodiments easier to understand and may differ from actual dimensions and proportions.

DETAILED DESCRIPTION

Figure 1:
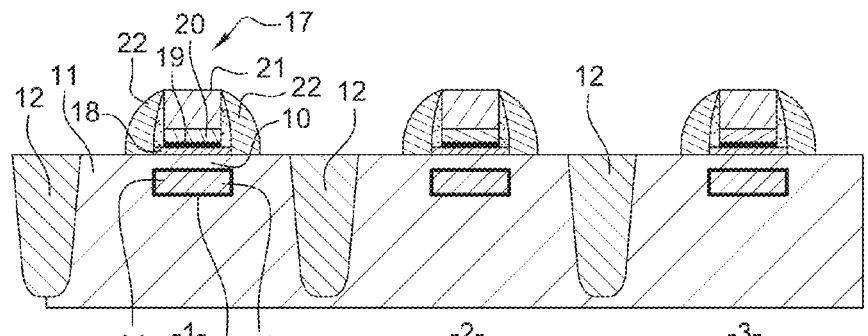
FIG. 1 is a transverse cross-sectional view of a set of three transistors produced according to a first embodiment.

As illustrated in FIG. 1, the set of three transistors shown has an essentially common structure. Each transistor 1, 2, 3 comprises a channel 10 produced in a semiconductor substrate 11. The various transistors 1, 2, 3 are separated from each other by deep insulating trenches 12. The transistor comprises a double-gate structure either side of channel 10. A first gate 14 is buried in the substrate and has, around its periphery, a high relative permittivity dielectric layer 15 which separates channel 10 from the deposited metal 16 that fills the corresponding volume.

Above substrate 11, the second gate structure or upper gate structure 17 has an electrode 20 that rests on a layer of high relative permittivity dielectric material 19 which itself rests on an insulating oxide layer 18 which itself rests on the substrate and, more especially, the area that forms channel 10. Classically, upper gate structure 17 comprises vertical walls 22 that are used to electrically insulate it from the rest of the component.

Above electrode 20, upper gate 17 comprises a conductive filler material 21 that can be one of several kinds as described later on.

According to one embodiment, the material that forms electrode 20, i.e. the material that is in contact with the layer of high relative permittivity dielectric material 19, may be different between the buried gate and the upper gate but it may also be identical in certain cases as described later on.

According to another embodiments, the material that forms electrode 20 of the upper gate varies from one transistor 1, 2, 3 to the next in order to define several and, in the case shown, three subsets of transistors that have different properties.

The term "different materials" is taken to mean materials that have different work functions. This may involve materials that are chemically different or materials that are chemically identical or similar but which differ in respect of one particular property, especially thickness. One example is titanium nitride (TiN) which, depending on its thickness, may exhibit work function variation.

Using materials that have different work functions makes it possible to create transistors that have different threshold voltages and this can prove useful in certain applications.

By way of example, for NMOS type transistors, one can choose aluminum or molybdenum as a material that has a low work function and this will result in transistors that have a relatively low threshold voltage.

An intermediate work function level can be obtained by using tantalum nitride or titanium nitride which provide a threshold voltage that is also intermediate.

For higher threshold voltages, one can choose materials that have higher work functions such as cobalt disilicide ($CoSi_2$) or titanium nitride which are used in greater thicknesses than in the previous example.

In the case of a PMOS transistor, one can, for instance, use titanium nitride or cobalt disilicide as a low work function material giving a high threshold voltage because of the majority carrier type for PMOS transistors.

Using a material that has an intermediate work function, such as nickel silicide, makes it possible to obtain an intermediate threshold voltage. Materials with a high work function such as nickel, gold or platinum make it possible to obtain lower threshold voltages.

Obviously, other examples of materials may be used provided this principle is respected, thus keeping to the spirit of the invention.

One can advantageously choose a material that has an intermediate work function for the buried gate structures, especially if one does not wish to give overall preference to a high or low threshold voltage.

As already mentioned, various implementation methods can be used to obtain the transistor structures mentioned above.

A first example of the method is described in FIGS. 2 to 19.

Figure 2:
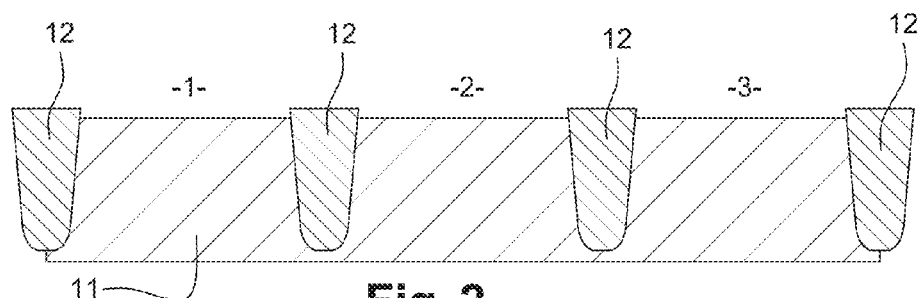
FIGS. 2 to 15 are cross-sectional views showing the sequencing of the various steps involved in manufacturing a set of three transistors in accordance with a first example of the manufacturing method.

In a first step shown in FIG. 2, a crystalline silicon substrate 11 is initially processed by making deep insulating trenches 12 in order to define the locations of the various transistors 1, 2, 3.

Figure 3:
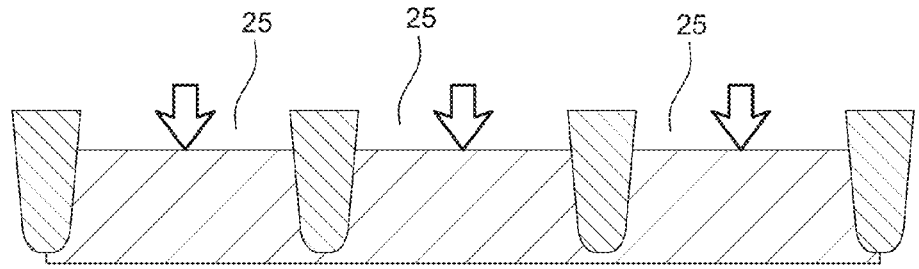

In a second step shown in FIG. 3, wet etching, using hydrochloric acid for example, is used to remove the silicon between insulating trenches 12. This etching forms openings 25 having a depth equivalent to the total thickness of the channel of the transistor and the thickness of the buried gate structure.

Figure 4:
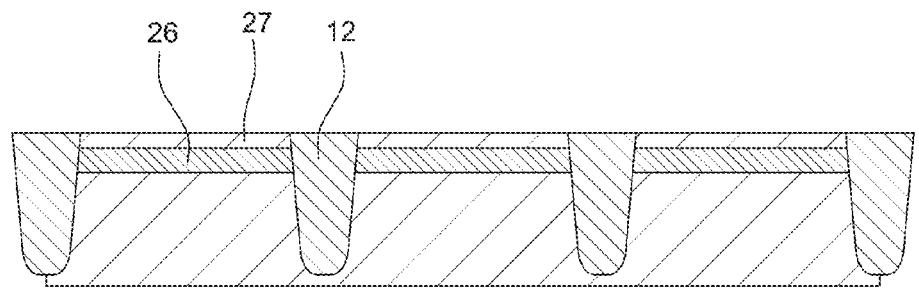

In a third step shown in FIG. 4, the volumes 25 thus created are filled by epitaxially growing a first sacrificial layer 26 based on a mixture of silicon and germanium. A germanium proportion of 25 to 35% is preferred in order to obtain a compromise, firstly, between the selectiveness of the process of etching the mixture relative to silicon and, secondly, the risks of silicon dislocation at the interface with this mixture.

The thickness of the sacrificial layer 26 of silicon/germanium is equivalent to the thickness of the future buried gate. Then a layer 27 of silicon is epitaxially grown. As shown in FIG. 4, the silicon of the future channel just reaches the level of insulating trenches 12.

Figure 5:
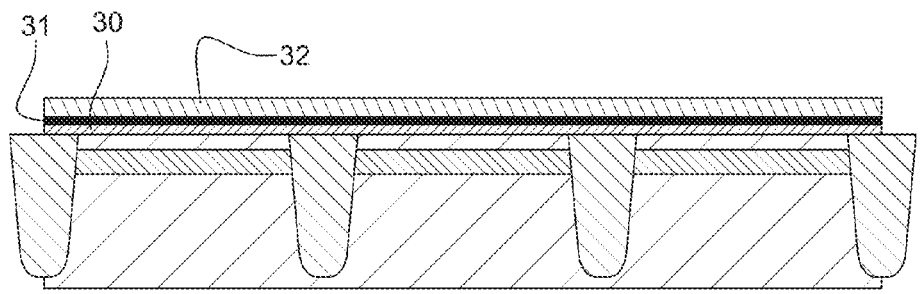

Then, as shown in FIG. 5, one deposits, on top of the substrate thus reformed, the layers that will form the lower part of the gate, namely a first oxide layer 30 that rests on silicon 27 of the channel, then a layer 31 of high relative permittivity dielectric material. Finally, one deposits a first layer 32 of a first metal that covers all the locations of transistors 1-3 without distinction. Prior to this stage, all the transistors are processed without differentiation.

Figure 6:
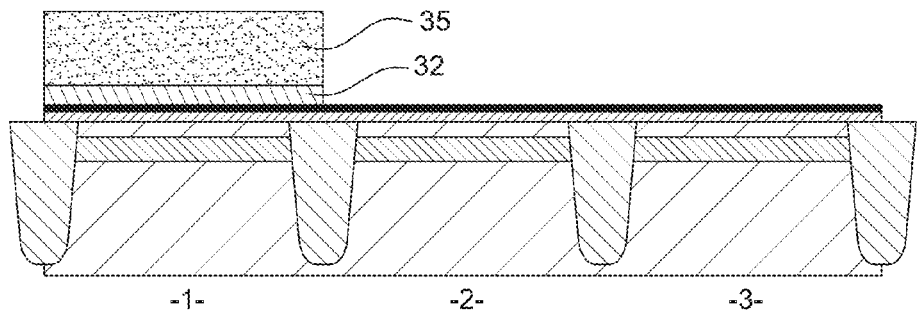

In a subsequent step, shown in FIG. 6, one deposits a photolithography resin 35 which is then removed from vertically above two of the three transistors in order to protect metal layer 32 deposited on first transistor 1 by an etching step intended to remove this metal layer from the other two transistors 2, 3.

Figure 7:
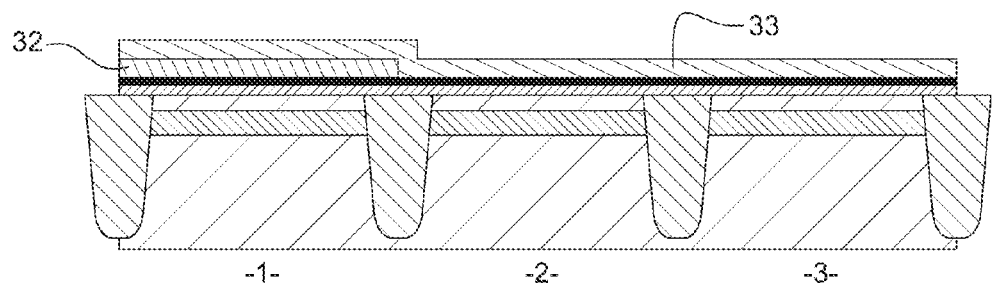

Subsequently and as shown in FIG. 7, one deposits a second layer 33 of metal after removing resin 35 which previously protected metal layer 32 of first transistor 1. This metal is different from the metal deposited on first transistor 1. It is this metal that is in contact with the dielectric layer of transistor 2 and whose work function will therefore determine the threshold voltage of transistor 2.

Figure 8:
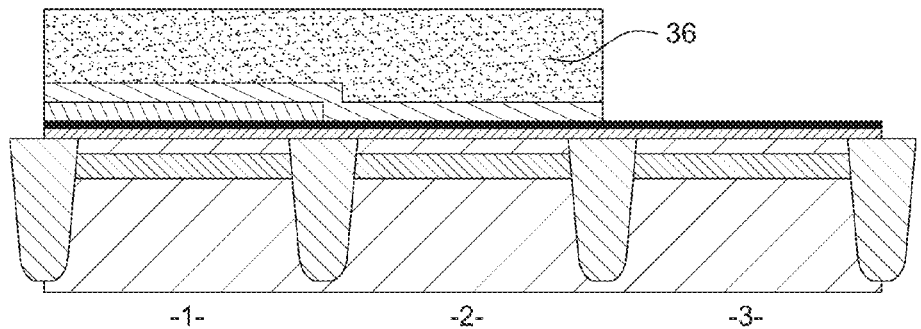

In a subsequent step shown in FIG. 8, one deposits a resin 36 which is then removed, only leaving resin on the second metal layer 33 deposited on first transistor 1 and second transistor 2. The second metal layer deposit is then removed from vertically above the third transistor 3 so as to expose the layer 31 of dielectric material.

Figure 9:
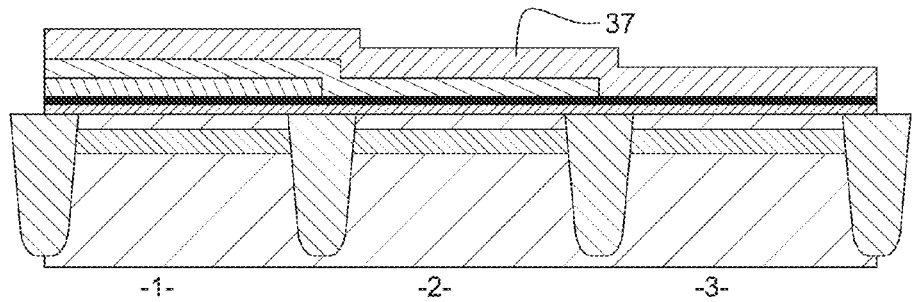

Depositing a third metal layer 37 makes it possible, as shown in FIG. 9, to produce the electrode of third transistor 3 using a material that is different from the materials of the electrodes of first transistor 1 and second transistor 2.

Figure 10:
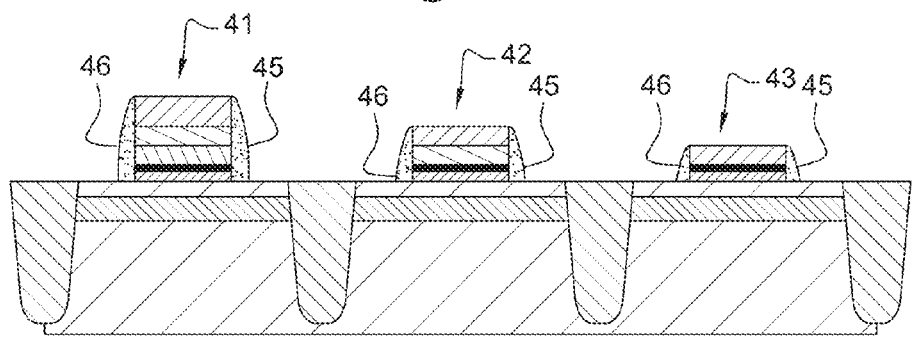

Then, as shown in FIG. 10, one removes the metal layers from the three transistors 1, 2, 3 in order to preserve only stacks 41, 42, 43 produced in the central part in order to define the three gate structures. Protective walls or spacers 45, 46 can thus be produced in order to protect the gate electrode and, more generally speaking, the gate structure of the rest of the component during the subsequent steps of the method.

Note that the gate structures thus defined extend longitudinally from one transverse insulating trench to another so that they do not rest exclusively on silicon layer 11 which forms the channel of the transistor but protrude slightly although this is not apparent in the Figures that show transverse cross-sectional views.

Figure 11:
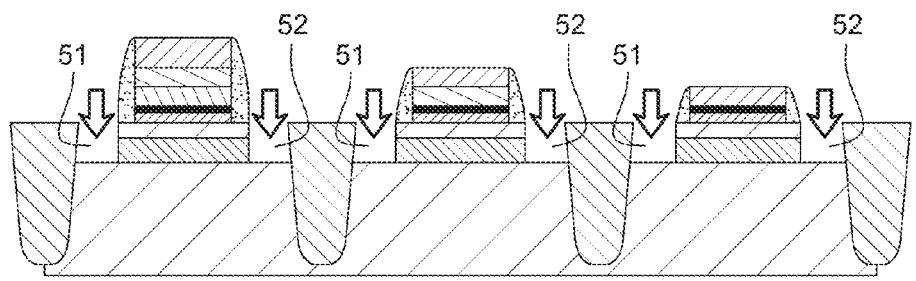

In a subsequent step shown in FIG. 11, anisotropic etching is performed to form openings 51, 52 by removing the silicon of upper layer 27 and the sacrificial material 26 in vertical alignment with those areas that are not covered by the gate structures.

Figure 12:
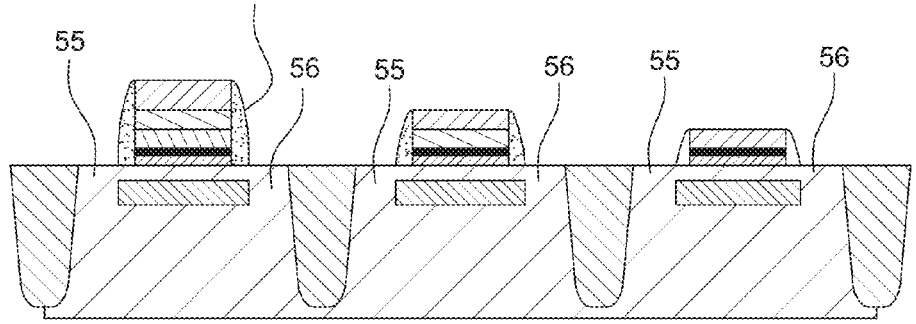

Then, as shown in FIG. 12, one fills volumes 51; 52 thus created by epitaxially growing silicon that forms future source junctions 55 and drain junctions 56. Note that sacrificial material 26 is preserved in the volume that will constitute the future buried gate.

Figure 13:
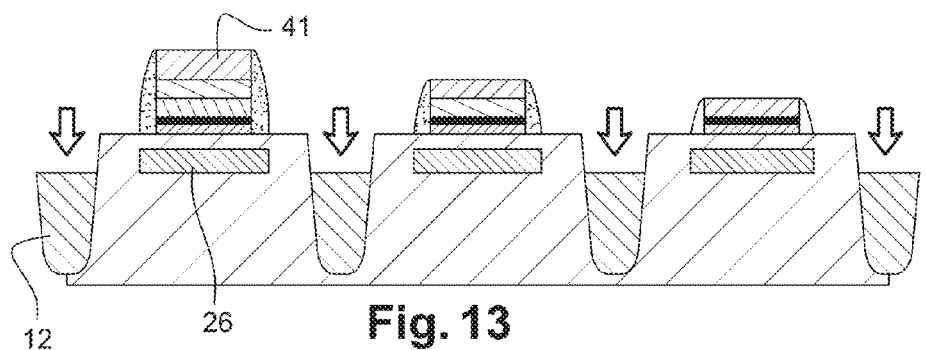
Figure 13A:
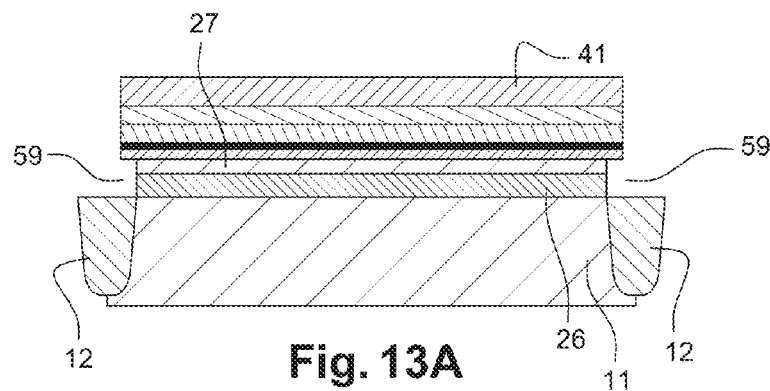
FIGS. 13A, 14A and 15A are longitudinal cross-sectional views of the transistors shown in FIGS. 13, 14 and 15 respectively in the same state of manufacture.

In a subsequent step shown in FIG. 13, insulating trenches 12 are etched to a depth substantially equivalent to the deepest level of sacrificial material 26. This etching is preferably isotropic etching in order to also remove those parts of the insulating trenches that are covered by the gate structures, as stated above, and defines volumes 58, 59 that are visible in FIG. 13A. This actually makes it possible to provide access to the ends of the volumes of sacrificial material 26 which are below the upper gate structure.

Figure 14:
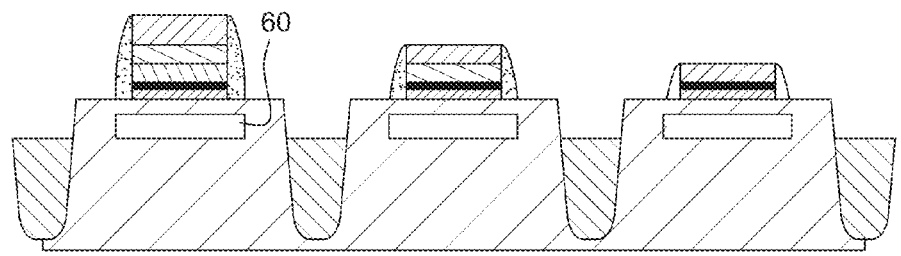
Figure 14A:
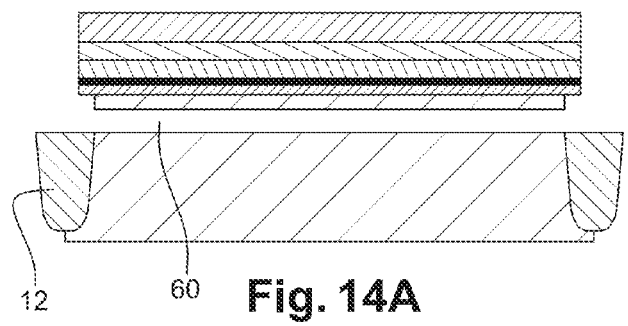

Then, as shown in FIG. 14, one etches the sacrificial material, typically using a tetrafluoromethane ($CF_4$) or sulfur hexafluoride ($SF_6$) plasma. This forms openings 60 which are intended to accommodate the future buried gates, as shown in FIG. 14A.

Figure 15:
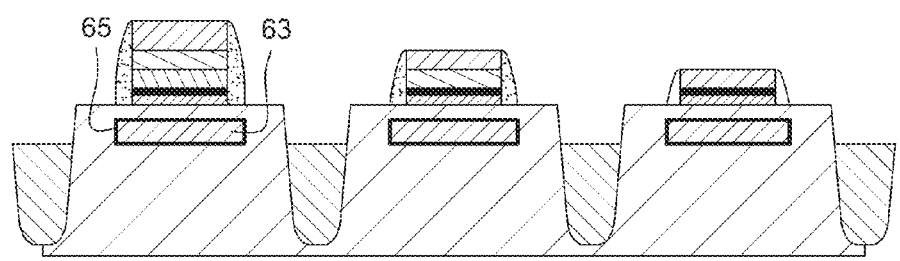

Then, as shown in FIG. 15, one deposits a layer 65 of high permittivity material which lines openings 60. Then one fills these openings with a deposited metal 63.

Figure 15A:
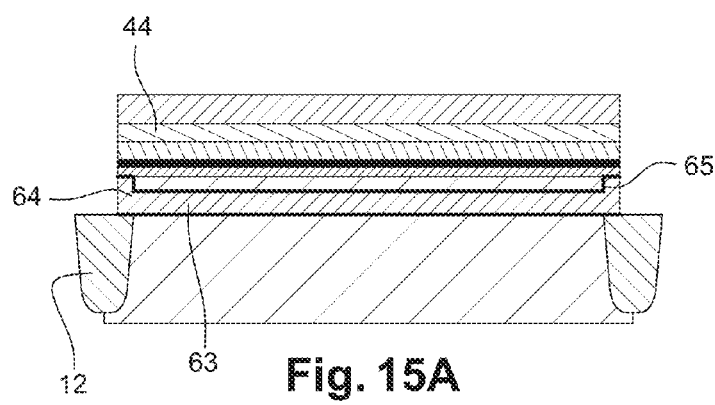

Thus, as shown in FIG. 15A, the lower gate structure extends over the same length as the upper gate structure and fills volumes 64, 65 located between insulating trenches 12 and the ends 44 of the upper gate structures.

In a subsequent step, one conventionally forms a silicided layer in vertical alignment with the source and drain junctions so as to facilitate electrical contact. One also deposits spacers 54 in order to improve the insulation of the transistor.

Subsequently and as shown in FIGS. 16, 17, 18, one produces contacts with the source and drain holes and the gate. In order to achieve this and as shown in FIG. 16, after depositing a dielectric layer 70, one forms vertical holes 71, 72, 73 which open out on the silicided areas created in vertical alignment with the source and drain junctions.

The holes that relate to the contacts of the source and drain junctions are then protected, as a subsequent step is required in order to link the buried gates structure and the upper gate structure.

As shown in FIG. 18, a mask 79 is placed over holes 71, 73 in which the contacts for the source and drain will be produced. Then, as shown in FIG. 19, additional etching is performed at the level of hole 72 formed in the gate contact so as to remove high permittivity layers 31, 65 and oxide layer 30 which separates the electrodes of the two gate structures.

The contacts are then produced in a conventional manner that is familiar to those skilled in the art.

An alternative manufacturing method is described in FIGS. 20 to 27.

In this case, the method starts with steps that are identical to those described in FIGS. 3, 4 and 5 of the first embodiment up to the formation of silicon layer 127 that will form the channel of the various transistors 101, 102, 103.

Figure 20:
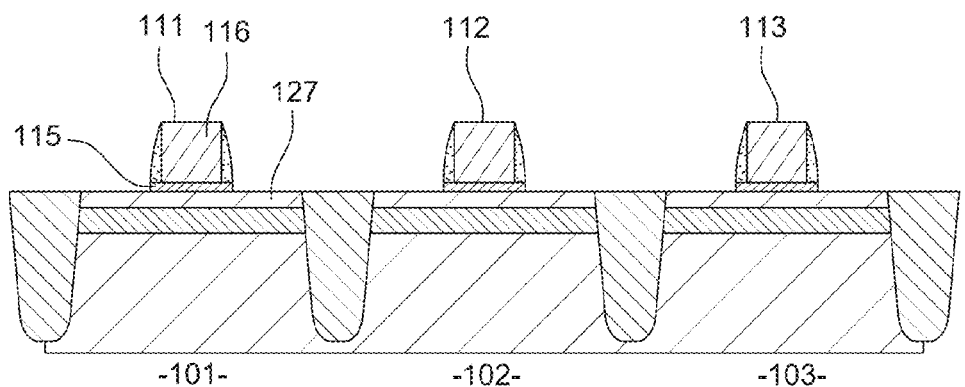
Figure 21:
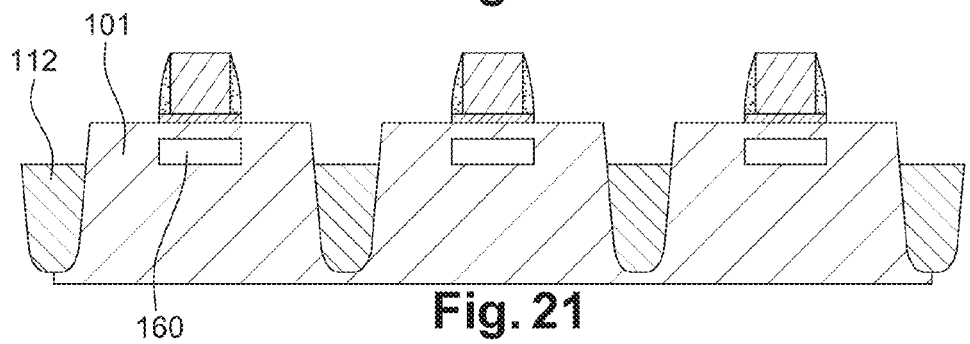

Thus, in a step subsequent to that shown in FIG. 20, one forms sacrificial gate structures 111, 112, 113 by depositing a layer 115 of silica and a layer 116 of polysilicon which are subsequently preserved only in the locations of the future gates, it being understood that silica layer 115 will remain in the final component whereas polysilicon layer 116 is used as a sacrificial material.

Then, one proceeds in a way that is similar to FIGS. 11 to 14 in the first embodiment in order to etch the areas of the future source and drain junctions, use epitaxial growth in order to form these junction regions, etch deep insulating trenches 1, 2 and remove the silicon/germanium-based sacrificial material that fills volume 160 of the future buried gates. This produces the structure shown in FIG. 21.

Figure 22:
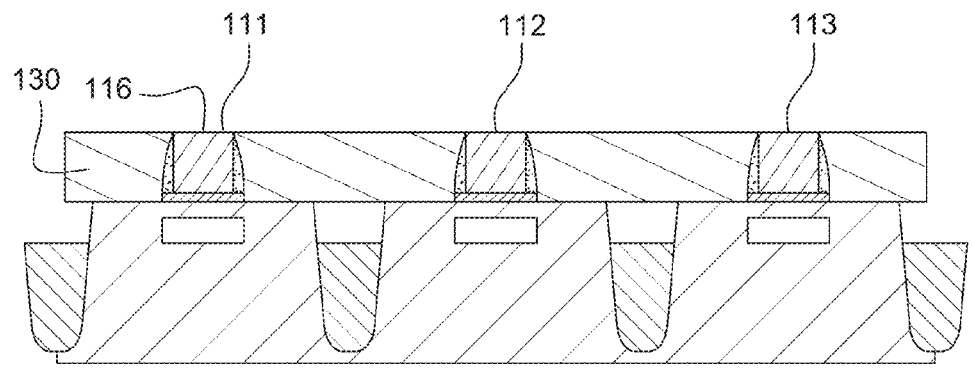

Then, in a step shown in FIG. 22, one deposits a dielectric material 130 in order to fill the volumes located between sacrificial gate structures 111, 112, 113. This assembly is then planarized in order to expose polysilicon layers 116 which form the sacrificial material of future upper gates 111, 112, 113.

Figure 23:
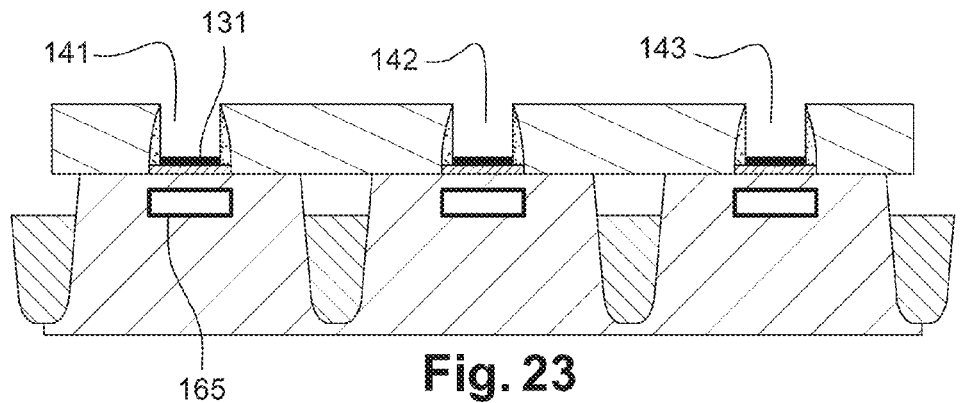

Then, as shown in FIG. 23, polysilicon areas 116 are then removed, opening up volumes 141, 142, 143 for the future upper gates, thus making it possible to deposit a layer 131 of high relative permittivity dielectric material. This material is deposited in the bottom of the future upper gates as well as over the entire periphery of the opening that will accommodate the future buried gate in order to form layer 165 that will separate the substrate from the electrode of the buried gate.

Figure 24:
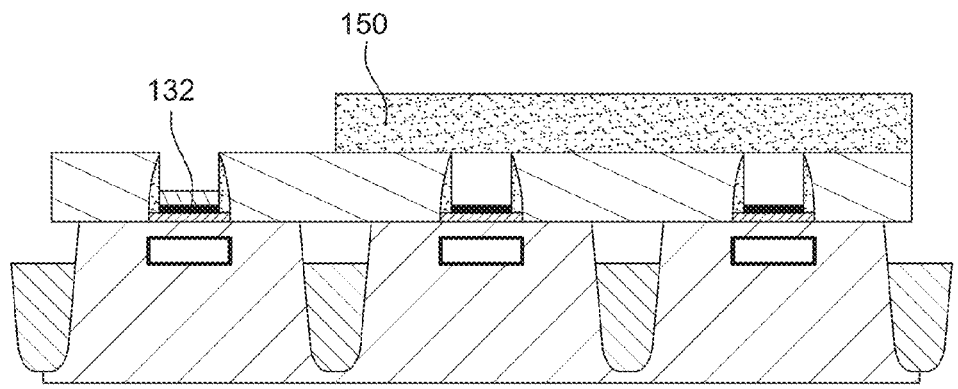

In a subsequent step shown in FIG. 24, a photolithography resin 150 is deposited, making it possible to protect the volumes 142, 143 for future upper gates for two transistors 102, 103. One deposits a non-compliant first metal in the free space 141 for first transistor 101. The non-compliant nature of this deposited layer 132 makes it possible to prevent this metal being deposited in other areas where it is not wanted, especially in the location of the future buried gates.

Figure 25:
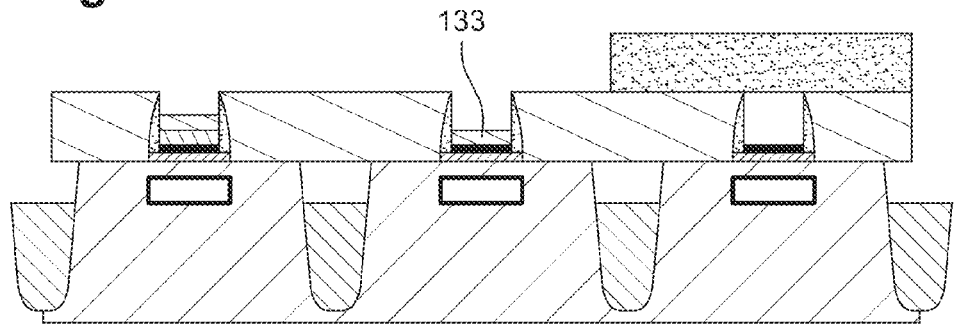

When electrode 132 of the upper gate of the first transistor has been thus formed, one can, as shown in FIG. 25, remove the resin mask that protects the second transistor in order to subsequently also deposit a non-compliant layer 133 of a second metal that is different from the metal that was deposited in the upper gate of the first transistor. Note that a similar layer 134 is also deposited on electrode 132 of the gate of the first transistor.

Figure 26:
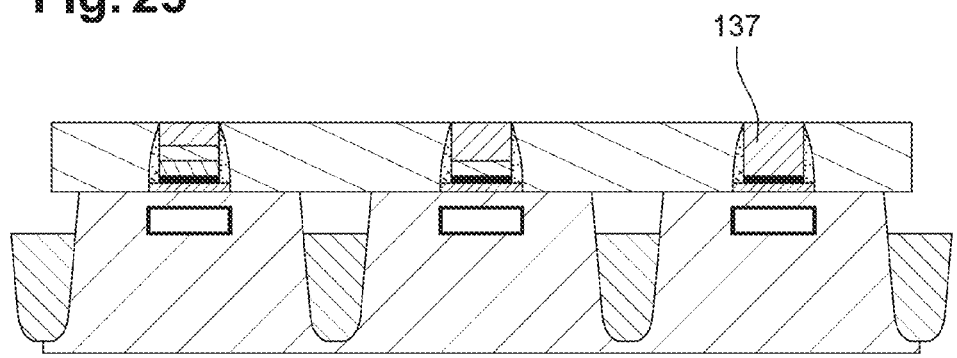

Similarly and as shown in FIG. 26, one then deposits a layer 137 of a third metal in order to form the electrode of the gate of the third transistor. This third metal is also deposited in the free spaces for the upper gates of the two other transistors.

Figure 27:
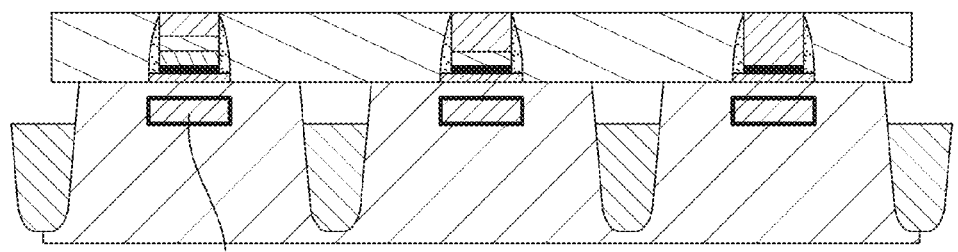

Then, as shown in FIG. 27, one deposits a compliant metal 163 in order to fill the volumes formed by the openings for the buried gates.

Note that it is also possible for this compliant metal to be deposited at the same time as one of the three metals 132, 133, 137 deposited for the upper gates and this makes it possible to eliminate one manufacturing step.

In this second embodiment, one reaps the benefit of producing the gate structure after the steps that involve annealing and this ensures that the dielectric properties of the gates are preserved. Another advantage of the method corresponding to this embodiment is that it makes it possible to define the gates more accurately.

An alternative that constitutes a third implementation method can also be used as shown in FIGS. 28 to 41.

In this example, because the first steps are common to all the transistors regardless of the set to which they will eventually belong, only a single transistor is represented in FIGS. 28 to 36.

Figure 28:
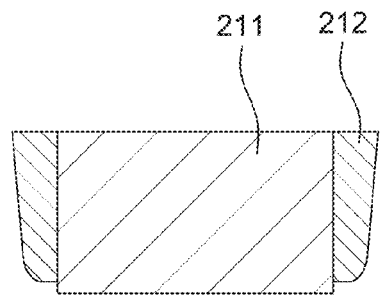
FIGS. 28 to 36 are transverse cross-sectional views of a single transistor showing the sequencing of the first steps in a third example of the manufacturing method.

Thus, as shown in FIG. 28, one uses, as already stated, a crystalline silicon substrate 211 in which insulating trenches 212 have been made.

Figure 29:
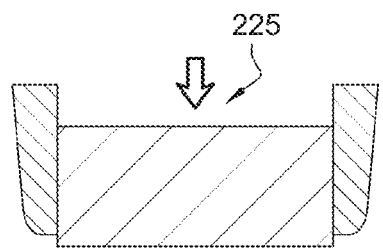

Then, as shown in FIG. 29, one etches the silicon, using hydrochloric acid for example, in order to define volume 225 in which the lower gate will be placed.

Figure 30:
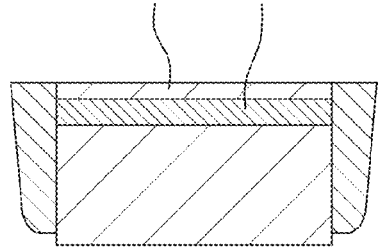

Then, as already stated and shown in FIG. 30, one epitaxially grows a deposited mixture of silicon/germanium 226, then a layer 227 of silicon that will form the future channel of the transistor.

Figure 31:
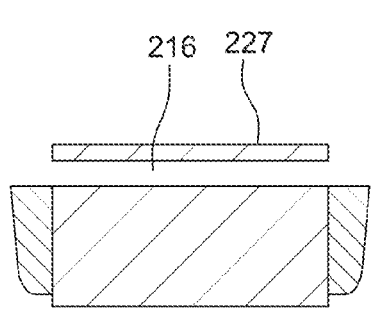

Then, as shown in FIG. 31, one isotropically etches insulating trenches 212 so as to reveal the edges of previously deposited layers 226 of silicon/germanium sacrificial material. Plasma etching, typically based on fluorine compounds, is then used to remove this sacrificial material as shown in FIG. 31.

Figure 32:
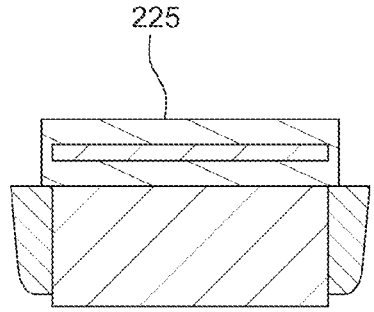

In a subsequent step shown in FIG. 32, one deposits a compliant layer 215 of hydrogen silsesquioxane (HSQ) used as a resin which therefore fills volume 216 opened up underneath layer 227 which forms the channel of the transistor.

Figure 33:
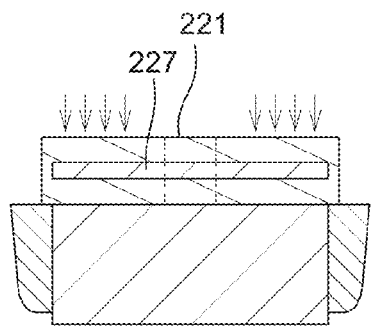

As shown in FIG. 33, this resin is exposed to specific radiation after applying a protective mask in vertical alignment with the future gates. This exposure to radiation transforms this HSQ layer into silica, apart from area 221 for the future gates which was protected from the radiation.

Figure 34:
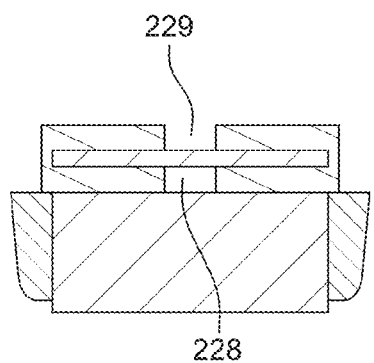

These areas 221 are then removed as shown in FIG. 34 so as to define two empty volumes 228, 229 that define the location of the future upper gate and the location of the buried gate.

Figure 35:
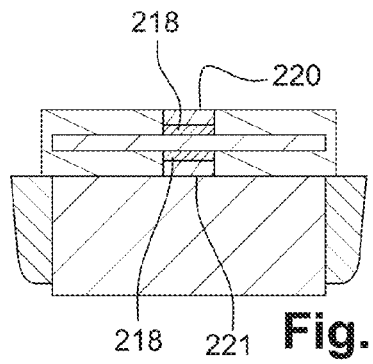

Then, as shown in FIG. 35, these volumes 228, 229 each accommodate sacrificial gate structures formed by a layer 218, 219 of silica ($SiO_2$) and a layer 220, 221 of polysilicon.

Figure 36:
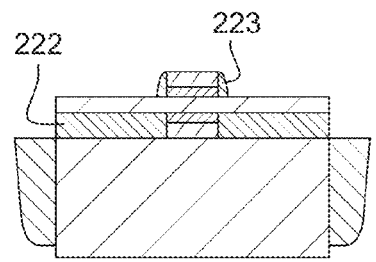

As shown in FIG. 36, the silica originating from the HSQ resin is removed, then one deposits a dielectric material 222 inside the opening made as well as on the upper layer where one then forms, by etching, spacers 223 of the future upper gate.

Figure 37:
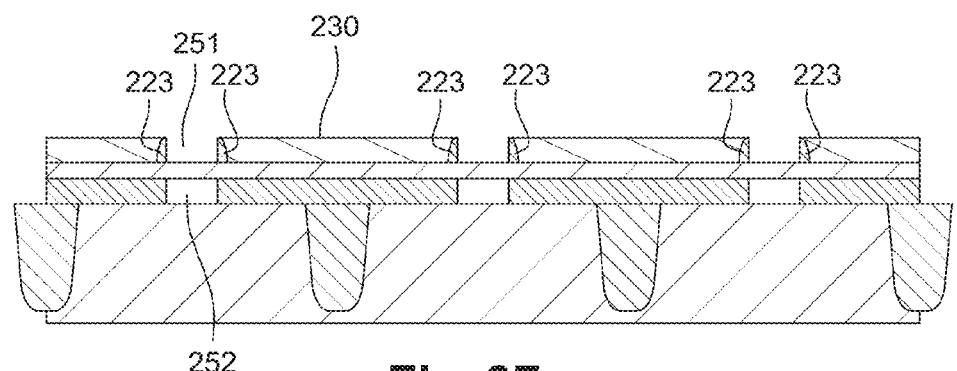
FIGS. 37 to 41 are transverse cross-sectional views of a set of three transistors shown as the sequence of manufacturing steps in the third example of the manufacturing process gradually progresses, starting from steps subsequent to that shown in FIG. 36.

Then, as shown in FIG. 37, one deposits 230 a dielectric material between the spacers of the future upper gates.

After planarizing in order to expose previously deposited polysilicon areas 220, one then etches these polysilicon areas that are used as a sacrificial material and this opens up volume 252 for the future buried gates and volume 251 for the future upper gates.

Figure 38:
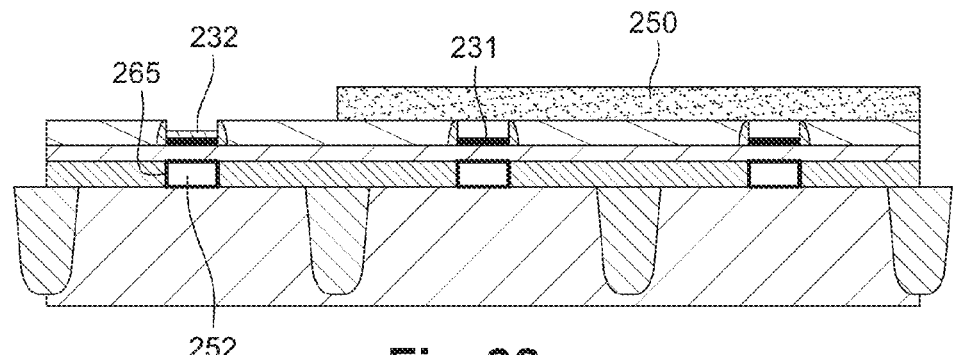

Then, as shown in FIG. 38, and in a way similar to that stated in the above examples, one deposits a layer 231, 265 of high relative permittivity dielectric material which lines the bottom of volume 254 for the future upper gate and volume 252 for the future buried gate.

Then, after depositing a resin mask 250 that protects two of the three transistors 202, 203, one deposits a non-compliant first metal layer 232 in the bottom of the future upper gate of first transistor 201 so as to form the electrode of the upper gate.

Figure 39:
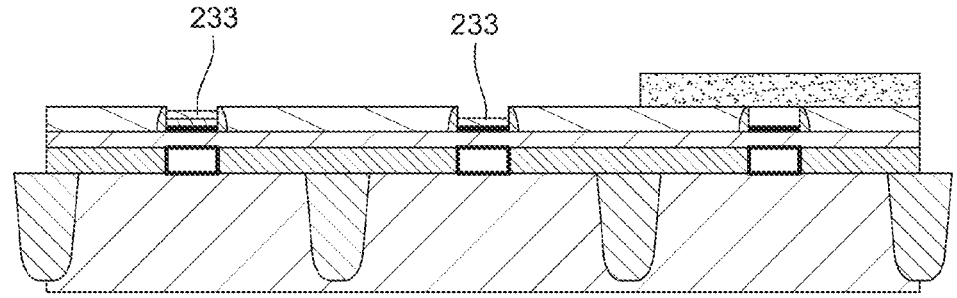

Then, as shown in FIG. 39, after removing part of protective mask 250, one also deposits a non-compliant layer of a second metal 233 that covers the electrode of the upper gate of first transistor 201 and covers the dielectric material 231 located at the bottom of the upper gate of the second transistor.

Figure 40:
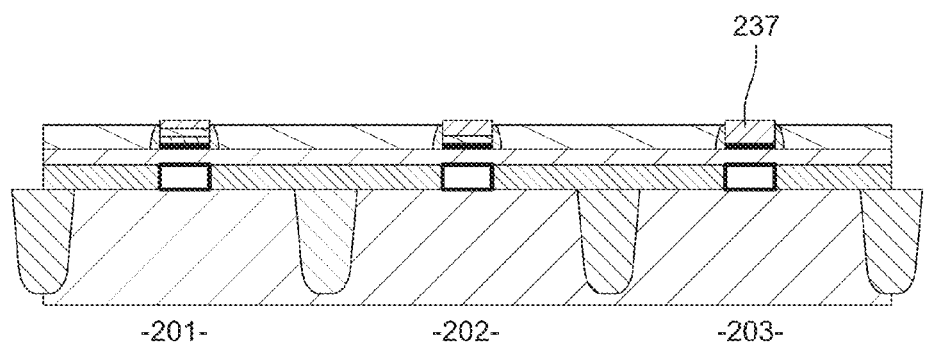

Then, as shown in FIG. 40, after removing the resin mask, one deposits a non-compliant layer of the third metal 237 which thus creates the electrode of the upper gate of third transistor 203.

Figure 41:
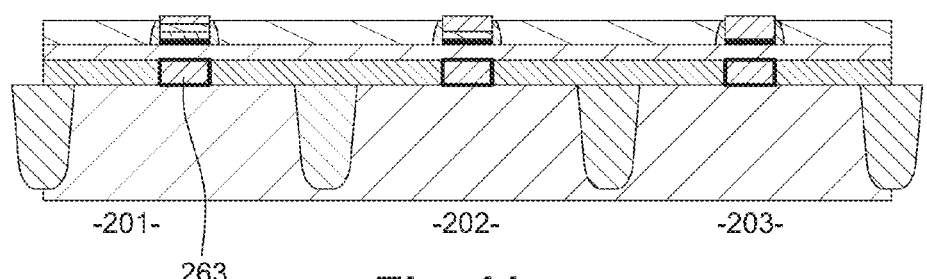

Then, as shown in FIG. 41, one deposits a compliant layer of metal 263 that forms the electrode of all the buried gates. Note that this material can be identical to one of the three metals previously used to produce the electrodes of the upper gate, in which case the latter may also be deposited compliantly.

Obviously, other incidental steps or steps that are not directly related to the invention can be used but they are not described here insofar as they have no direct impact on the invention.

The above descriptions show that the method according to the invention and the transistor structure thus obtained make it possible to achieve good electrostatic immunity inside the channel because the method makes it possible to use silicon channels that are not doped thanks to the presence of the double-gate structure.

This advantage is combined with the ability to produce transistors that have different threshold voltage levels depending on the selected materials.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Electronic component comprising a number of insulated-gate field effect transistors, said transistors belonging to at least two distinct subsets by virtue of their threshold voltage, wherein each transistor has two gates, namely a first gate embedded in the substrate where the channel of the transistor is defined and separated from said channel by a layer of dielectric material and a second upper gate located above the substrate and facing buried gate relative to channel, with the upper gates having a layer that is in contact with a single stack of dielectric material which is formed by materials that differ from one transistor to another and wherein the buried gates of the set of transistors are formed by an identical material.

2. Component as claimed in claim 1, wherein the transistors are divided up into three distinct subsets.

3. Component as claimed in claim 1, wherein the upper gates are formed by stacking layers of different materials, with the number of layers differing from one subset of transistors to another.

4. Component as claimed in claim 1, wherein the material of the buried gates is different from the materials of the upper gates of all the subsets of transistors.

5. Component as claimed in claim 1, wherein the material of the buried gates is part of the group of materials used in order to form the upper gates.

6. Component as claimed in claim 1, wherein, for NMOS type transistors and a first subset, the layer of the upper gate that is in contact with the layer of dielectric material is a material chosen from a group comprising aluminum and molybdenum.

7. Component as claimed in claim 1, wherein, for NMOS type transistors and a second subset, the layer of the upper gate that is in contact with the layer of dielectric material is a material chosen from a group comprising tantalum nitride and titanium nitride.

8. Component as claimed in claim 1, wherein, for NMOS type transistors and a third subset, the layer of the upper gate that is in contact with the layer of dielectric material is a material chosen from a group comprising titanium nitride and cobalt disilicide ($CoSi_2$).

9. Component as claimed in claim 1, wherein, for PMOS type transistors and a first subset, the layer of the upper gate that is in contact with the layer of dielectric material is a material chosen from a group comprising nickel, gold and platinum.

10. Component as claimed in claim 1, wherein, for PMOS type transistors and a second subset, the layer of the upper gate that is in contact with the layer of dielectric material is a material chosen from a group comprising silicon and nickel.

11. Component as claimed in claim 1, wherein, for PMOS type transistors and a third subset, the layer of the upper gate that is in contact with the layer of dielectric material is a material chosen from a group comprising titanium nitride and cobalt disilicide ($CoSi_2$).

12. Method for manufacturing a number of insulated-gate field effect transistors on a semiconductor substrate which involves:
    making a recessed opening in the substrate located underneath the channel of each transistor;
    above each channel, producing upper gate structures having at least two types of metallic materials defining at least two subsets of transistors that have different threshold voltages; and
    depositing, in the recessed openings, a dielectric material then filling the openings with an identical metallic material for all the transistors in order to define a buried gate structure.

13. Method as claimed in claim 12, wherein one deposits the metallic materials for the upper gate structures by successively depositing different metal layers with the number of deposited layers defining the subset to which the transistor belongs.

14. Method as claimed in claim 12, wherein:
    one forms the openings then one fills them with a sacrificial material;
    one produces the upper gate structures, including the metallic materials;
    one removes the sacrificial material from the openings;
    one fills the recessed openings with a metallic material.

15. Method as claimed in claim 12, wherein:
    one forms upper gate structures by using a sacrificial material instead of electrodes;
    one produces recessed openings;
    one removes the sacrificial material from the upper gate structures;
    one deposits the metallic materials of the upper gate structures;
    one fills the recessed openings with a metallic material.

16. Method as claimed in claim 12, wherein:
    one produces the recessed openings and the areas that form the locations of the upper gate structures at the same time;
    one deposits the metallic materials of the upper gate structures in said areas;
    one fills the recessed openings with a metallic material.

* * * * *